United States Patent
Lou

(10) Patent No.: US 6,174,769 B1
(45) Date of Patent: Jan. 16, 2001

(54) METHOD FOR MANUFACTURING STACKED CAPACITOR

(75) Inventor: Chine-Gie Lou, Hsinchu Hsien (TW)

(73) Assignee: Worldwide Semiconductor Manufacturing Corp., Hsinchu (TW)

(*) Notice: Under 35 U.S.C. 154(b), the term of this patent shall be extended for 0 days.

(21) Appl. No.: 09/335,547

(22) Filed: Jun. 18, 1999

(30) Foreign Application Priority Data

Apr. 27, 1999 (TW) .................................. 88106718

(51) Int. Cl.$^7$ .............................................. H01L 21/8242
(52) U.S. Cl. .................... 438/253; 438/254; 438/255; 438/396; 438/397; 438/398
(58) Field of Search .................................. 438/238, 239, 438/253, 254, 255, 396, 397, 398

(56) References Cited

U.S. PATENT DOCUMENTS

| | | | |
|---|---|---|---|
| 5,741,626 | * 4/1998 | Jain et al. | 438/633 |
| 5,763,306 | * 6/1998 | Tsai | 438/255 |
| 5,827,766 | * 10/1998 | Lou | 438/253 |
| 5,913,119 | * 6/1999 | Lin et al. | 438/255 |

FOREIGN PATENT DOCUMENTS

WO 94/00877 * 1/1994 (DE) .................. H01L/21/82

* cited by examiner

*Primary Examiner*—Carl Whitehead, Jr.
*Assistant Examiner*—Toniae M. Thomas
(74) *Attorney, Agent, or Firm*—J.C. Patents; Jiawei Huang

(57) ABSTRACT

A method for manufacturing stacked capacitor. The method utilizes a manufacture method of a trench line and a via applied in dual damascene process to form a trench line and a via in a dielectric layer. Then, multi-amorphous silicon layers with different doping concentration are conformally formed on an exposed surface of the trench line and the via to serve as a bottom electrode of a double-sided double-crown-shaped capacitor. Furthermore, a phosphine ($PH_3$) treatment process is performed after hemispherical grains are formed on the bottom electrode of the double-sided double-crown-shaped capacitor to increase the doping concentration of the bottom electrode surface of the capacitor. Moreover, a poly slurry having a high polishing selectivity of amorphous silicon to silicon nitride is used in a chemical mechanical polishing process during the formation of the double-sided double-crown-shaped capacitor to promote good uniformity of the polished wafer and make the polish end point available.

19 Claims, 7 Drawing Sheets

METHOD FOR MANUFACTURING STACKED CAPACITOR

CROSS-REFERENCE TO RELATED APPLICATION

This application claims the priority benefit of Taiwan application serial no. 88106718, filed Apr. 27, 1999, the full disclosure of which is incorporated herein by reference.

BACKGROUND OF THE INVENTION

1. Field of Invention

The present invention relates to a method for manufacturing the capacitor of a semiconductor memory cell. More particularly, the present invention relates to a method for manufacturing a stacked capacitor of dynamic random access memory (DRAM).

2. Description of Related Art

As semiconductor device manufacturing progresses into the deep sub-micron range, dimensions of each semiconductor are all reduced. One consequence of this is the reduction of space for accommodating a capacitor having a conventional DRAM structure. In contrast, the size of software needed to operate a computer is forever growing, and hence the needed memory capacity must be increased. In the presence of these conflicting requirements, some changes have to be made regarding the design of DRAM capacitors.

A stacked capacitor structure is the principle type of capacitor to be used in manufacturing semiconductor memory. The stacked type of capacitor has been used for quite some time and continues to be used, even in sub-micron device fabrication.

Stacked capacitors can be roughly classified into crown-shaped, fin-shaped, cylinder-shaped or spread-out type. Although any of these stacked capacitors is able to satisfy the high density requirement of DRAMs, simply using such conventional structures to fabricate the capacitor can hardly go beyond 256 megabit (Mb) memory capacity.

However, the memory capacity can be promoted by increasing the surface area of the lower electrode of a crown-shaped capacitor so that higher memory capacity becomes possible. For example, the surface area of a capacitor can be further increased by selectively growing hemispherical grains (HSGs) on the low electrode.

FIGS. 1A through 1E are cross-sectional views showing the progression of manufacturing steps in fabricating a conventional double-sided crown-shaped capacitor.

First, as shown in FIG. 1A, a substrate 100 having a number of devices (not shown) thereon is provided. Next, a silicon oxide layer 102 and a silicon nitride layer 104 are sequentially formed over the substrate 100. The silicon oxide layer 102 serves as an inter-layer dielectric (ILD) while the silicon nitride layer 104 serves as an etching stop layer during the fabrication of the double-sided crown-shaped capacitor. Both the silicon oxide layer 102 and the silicon nitride layer 104 can be formed using a chemical vapor deposition (CVD) method, for example.

Thereafter, photolithographic and etching operations are conducted to form a contact opening 106 that passes through the silicon oxide layer 102 and the silicon nitride layer 104. Next, a doped polysilicon plug is formed inside the contact opening 106. The doped silicon plug can be formed by first depositing a layer of doped polysilicon (not shown in the figure) over the silicon nitride layer 104 and filling the contact opening 106 using a chemical vapor deposition (CVD) process. Then, the doped polysilicon layer above the silicon nitride layer 104 is removed using, for example, a reactive ion etching (RIE) method.

Next, as shown in FIG. 1B, an insulation layer 108 is formed over the silicon nitride layer 104. The insulation layer 108 can be formed using, for example, a chemical vapor deposition (CVD) method. The insulation layer 108 is made, for example, from borophosphosilicate glass (BPSG). Thereafter, an opening 110 that exposes the contact opening 106 is formed using photolithographic and etching techniques.

Following, as shown in FIG. 1C, an amorphous silicon layer 112 conformal to the opening 110 and the surrounding insulation layer 108 is formed. The amorphous silicon layer 112 is formed using, for example, a low-pressure chemical vapor deposition (LPCVD) method.

Next, as shown in FIG. 1D, using the insulation layer 108 as a polishing stop layer, the amorphous silicon layer 112 above the insulation layer 108 are removed. Hence, only the amorphous silicon layer 112a inside the opening 110 remains. The method of removing portions of the amorphous silicon layer 112 includes a chemical-mechanical polishing (CMP) method.

Next, as shown in FIG. 1E, using the silicon nitride layer 104 as an etching stop layer, the insulation layer 108 above the silicon nitride layer 104 is removed using a wet etching method, for example. Hence, a crown-shaped capacitor structure is obtained.

Thereafter, hemispherical grains are formed on the exposed surface of amorphous silicon layer. Next, dielectric material is deposited to form a capacitor dielectric layer, and then an upper electrode is formed over the capacitor dielectric layer to form the double-sided crown-shaped capacitor. Since subsequent operations should be familiar to those skilled in the art of semiconductor manufacture, detailed descriptions are omitted here.

However, if the doping concentration in the amorphous silicon layer is insufficient in the manufacture of prior art, the hemispherical grains will have a undoped surface during its growth which results in a capacitance depletion effect. The capacitance depletion effect can contribute 25 percents degradation in capacity.

The capacitance depletion effect can be resolved due to an increment of the doping concentration in the amorphous silicon layer. Unfortunately, the high doping concentration in the amorphous silicon layer can inhibit the migration of silicon atoms resulting in the hemispherical grains being hard to form. The surface area-gain provided by hemispherical grains therefore decreases to affect the capacity of a capacitor.

SUMMARY OF THE INVENTION

The present invention provides a method of manufacturing a stacked capacitor that utilizes multi-amorphous silicon layer with different doping concentrations to resolve the capacitance depletion effect and the decrement of the area-gain of the hemispherical grains. Meanwhile, this invention utilizes a manufacture method of forming a trench line and a via applied in dual damascene process to get a double-sided double-crown-shaped capacitor with a more bottom electrode surface.

To achieve these and other advantages and in accordance with the purpose of the invention, as embodied and broadly described herein, the invention provides a method of forming a stacked capacitor. The method includes providing a substrate and forming a first dielectric layer over the substrate. A contact opening is formed in the first dielectric layer and a conductive plug is formed inside the contact opening. A second dielectric layer is formed over the substrate and a trench line is formed in the second dielectric layer. A via is formed in the second dielectric layer beneath the trench line and the conductive plug is exposed. An undoped first amorphous silicon layer is formed conformally to the trench line and the via. A doped second amorphous silicon layer is formed over the undoped first amorphous silicon layer. An undoped third amorphous silicon layer is formed over the doped second amorphous silicon layer. A photoresist layer is formed over the substrate to fill the trench line and the via. The photoresist layer, the undoped third amorphous silicon layer, the doped second amorphous silicon layer and the undoped first amorphous silicon layer above the second dielectric layer are removed using the second dielectric layer as a polishing stop layer. The photoresist layer filling in the trench line, the via and the second dielectric layer is removed thereafter. A plurality of hemispherical grains are formed over an exposed surface of the undoped first amorphous silicon layer and the undoped third amorphous silicon layer. And, a doping process to the hemispherical grains, the undoped first amorphous silicon layer and the undoped third amorphous silicon layer is performed.

According to this invention, a manufacture method of a trench line and a via applied in dual damascene process is utilized to form a trench line and a via in a dielectric layer. Then, conformal multi-amorphous silicon layers with different doping concentration are formed on an exposed surface of the trench line and the via to serve as a bottom electrode of a double-sided double-crown-shaped capacitor. Furthermore, a phosphine ($PH_3$) treatment process is performed after hemispherical grains formed on the bottom electrode of the double-sided double-crown-shaped capacitor to increase the doping concentration of the bottom electrode surface of the capacitor.

Since this invention utilizes a manufacture method of a trench line and a via applied in dual damascene process to form a double-sided double-crown-shaped capacitor. It provides more bottom electrode surface of a capacitor to increase the capacitance of a memory device.

In this invention, a poly slurry having a good polish ability to amorphous silicon is used during a chemical mechanical polishing process. The poly slurry has a high polishing selectivity of amorphous silicon to silicon nitride, i.e. higher than 80, so that the polish end point is easily to be detected and good uniformity of a polished wafer can be promoted.

In this invention, an amorphous silicon layer formed as a double-sided double-crown-shaped structure has an undoped concentration surface which does not inhibit migration of silicon atoms during the formation of hemispherical grains. The hemispherical grains therefore are easily formed and possess a higher surface area-gain.

After the formation of the hemispherical grains, a phosphine ($PH_3$) treatment is performed to increase the doping concentration of the bottom electrode surface of a capacitor. Thus, the capacitance depletion effect can be resolved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
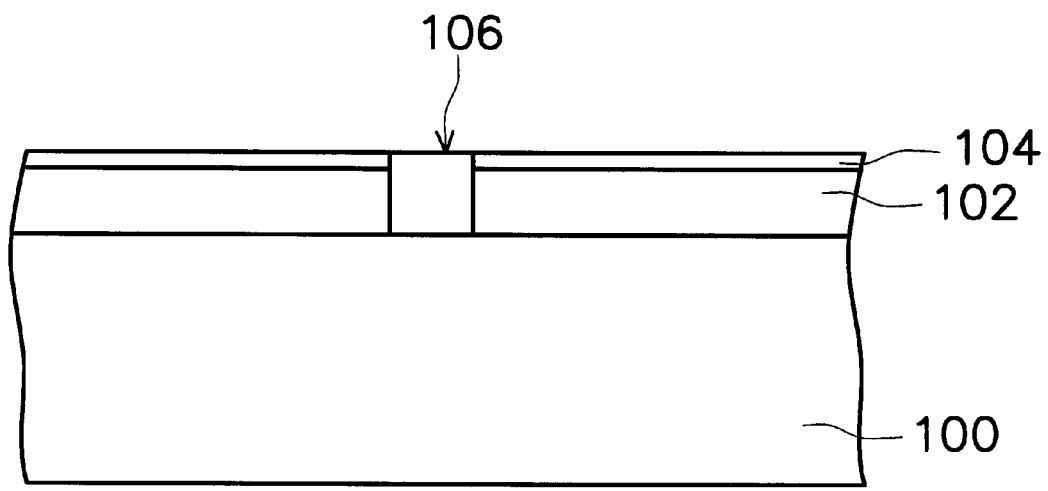
FIGS. 1A through 1E are cross-sectional views showing the progression of manufacturing steps in fabricating a conventional double-sided crown-shaped capacitor.
Figure 1B:
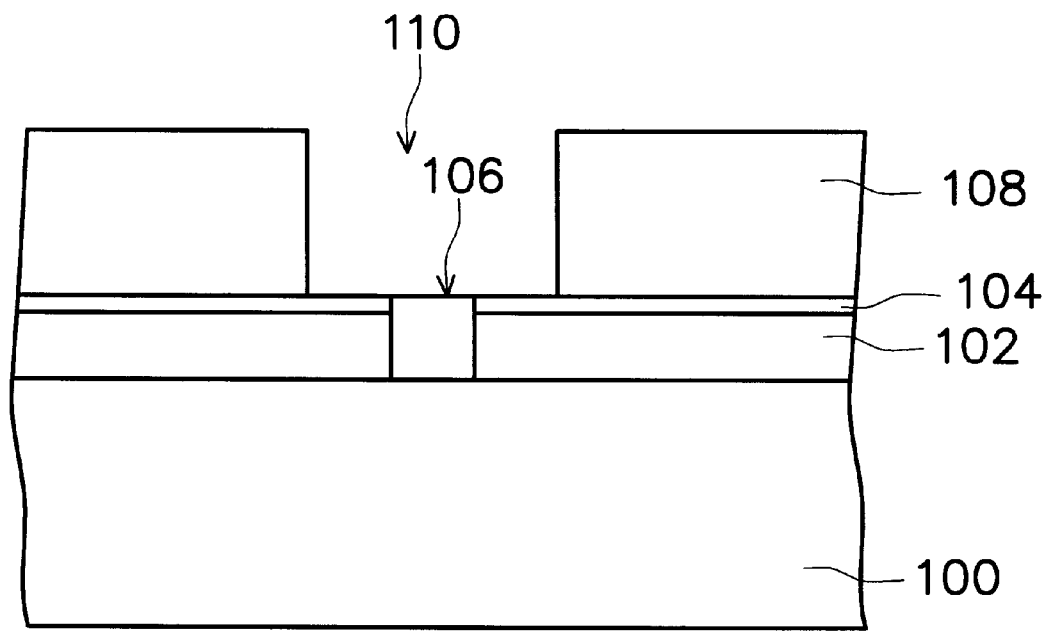
Figure 1C:
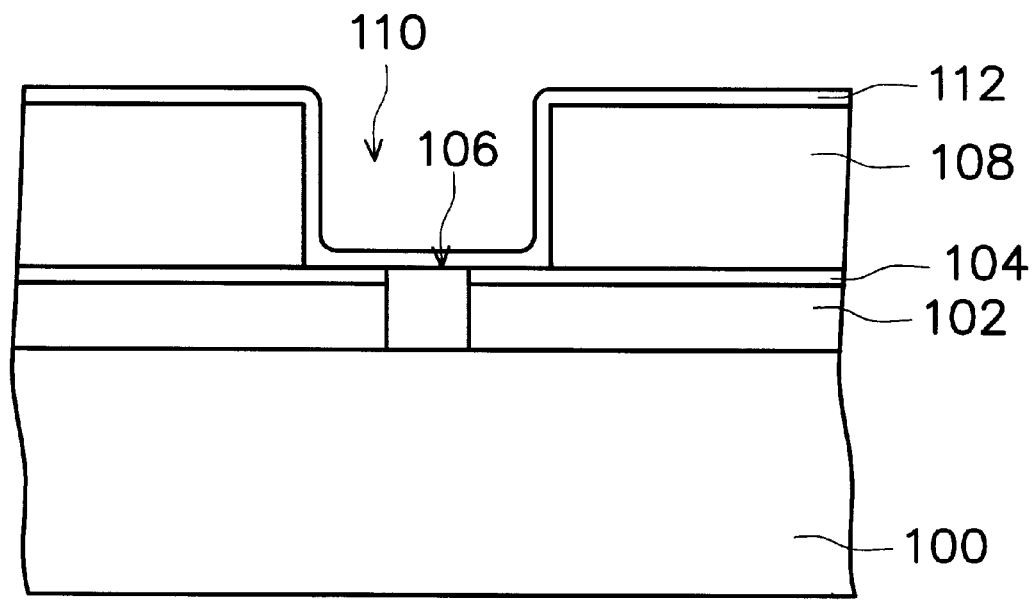
Figure 1D:
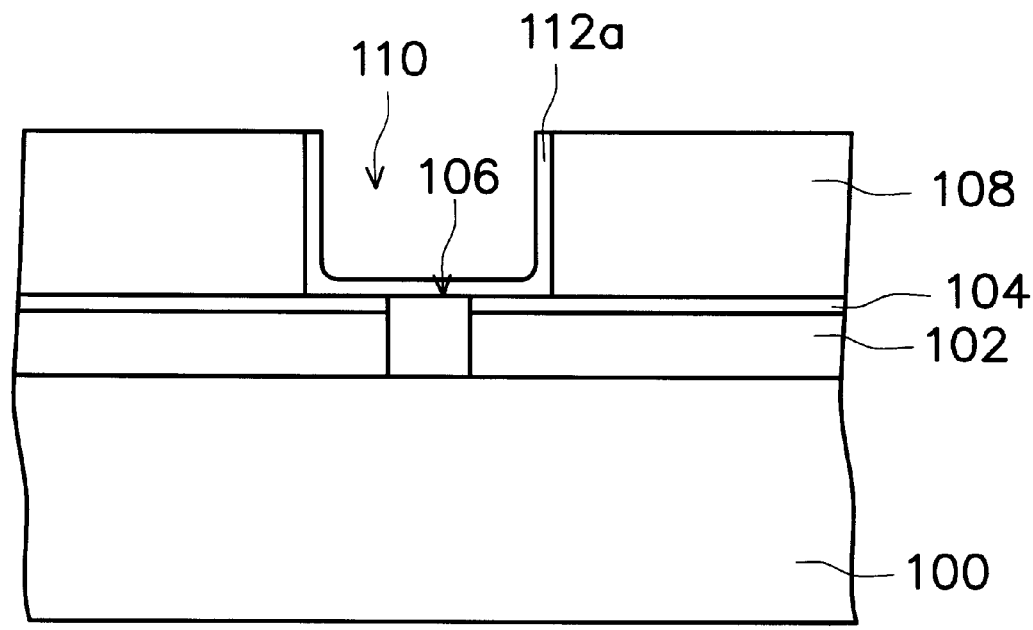
Figure 1E:
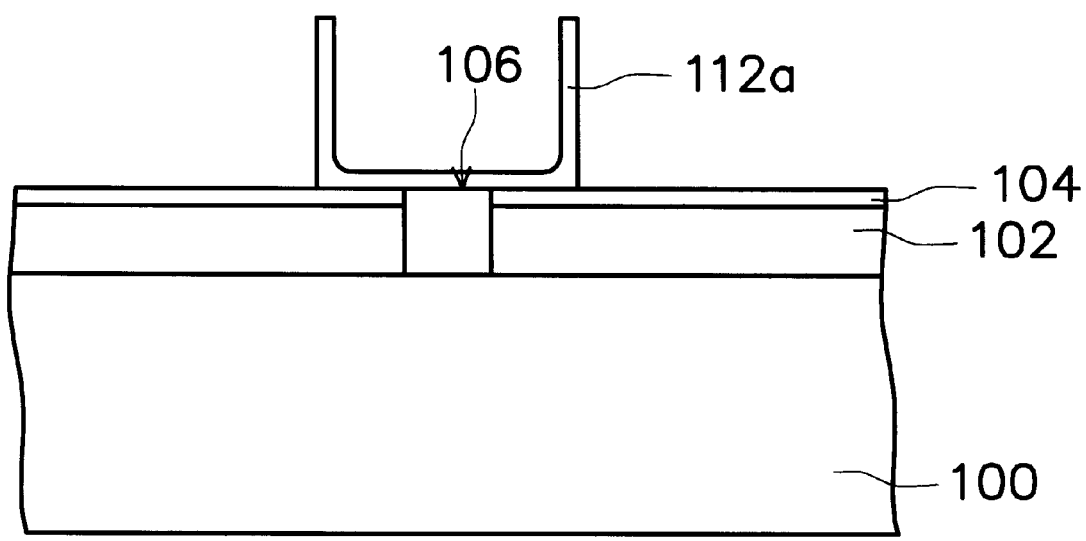

Reference now be made in detail to the present preferred embodiments of the invention, examples of which are illustrated in the accompanying drawings. Wherever possible, the same reference numbers are used in the drawings and the description to refer to the same or like parts.

FIGS. 2A through 2G are cross-sectional views showing the progression of manufacturing steps in fabricating a double-sided double-crown-shaped capacitor according to this invention.

Figure 2A:
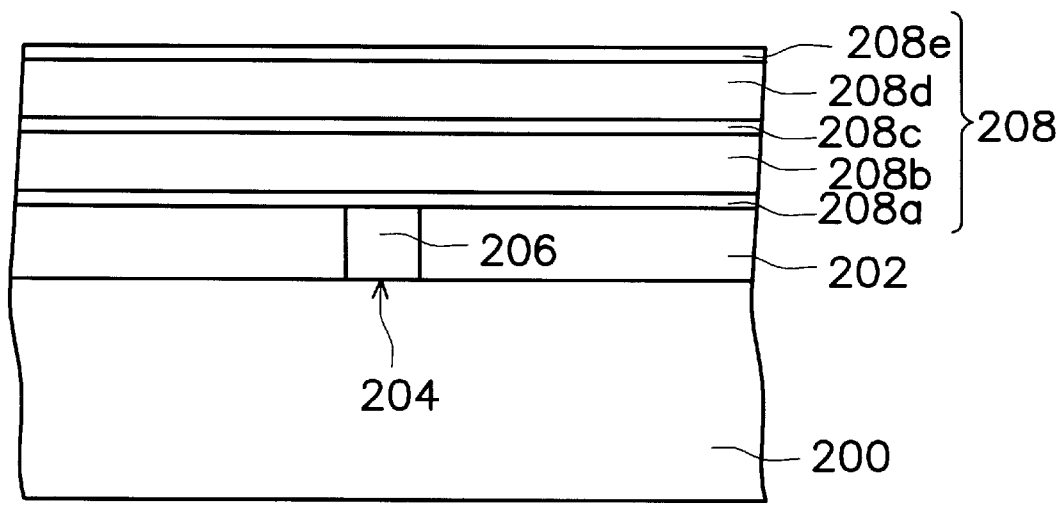
FIGS. 2A through 2G are cross-sectional views showing the progression of manufacturing steps in fabricating a double-sided double-crown-shaped capacitor according to this invention.

As shown in FIG. 2A, a substrate 200 having a number of devices thereon is provided. A dielectric layer 202 is formed over the substrate 200. The dielectric layer 202 serves as an inter-layer dielectric layer formed using, for example, a chemical vapor deposition (CVD) process.

Photolithographic and etching techniques are used to form a contact opening 204 that passes through the dielectric layer 202. A conductive plug 206 is formed inside the contact opening 204. The conductive plug 206 is formed by first depositing a conductive layer (not shown in the figure) over the dielectric layer 202 and completely filling the contact opening 204 using, for example, a chemical vapor deposition (CVD) method. Then, the conductive layer above the dielectric layer 202 is removed using, for example, a reactive ion etching method. The conductive plug 206 can be made, for example, from doped polysilicon whose doping concentration is preferably around 5E19 ions/$cm^3$.

A dielectric layer 208 is formed over the dielectric layer 202 and the conductive plug 206. For example, the dielectric layer 208 includes a silicon nitride layer 208a, a silicon oxide layer 208b, a silicon nitride layer 208c, a silicon oxide layer 208d, and a silicon nitride layer 208e sequentially formed using a chemical vapor deposition (CVD) method.

Figure 2B:
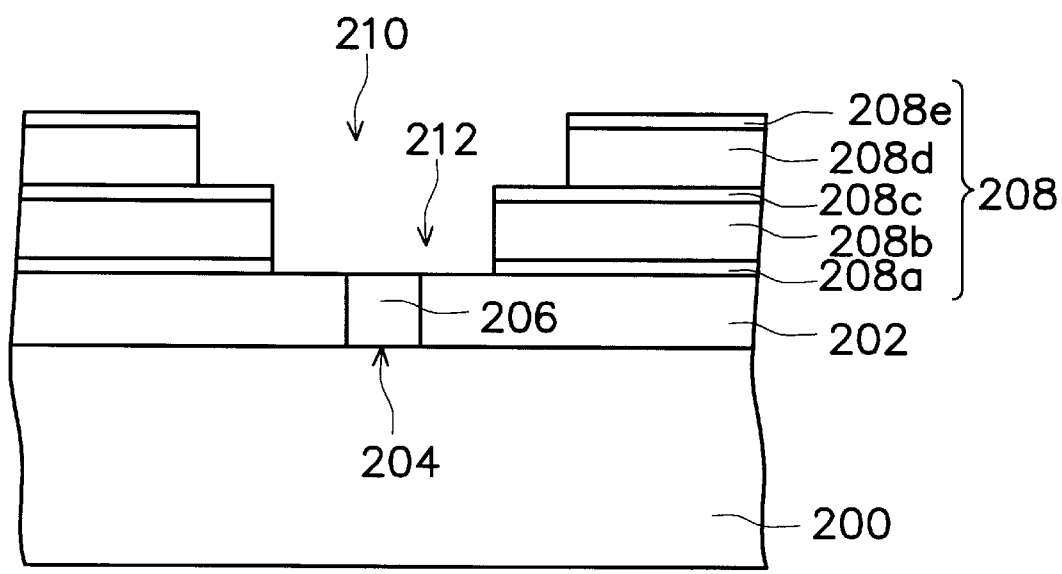

As shown in FIG. 2B, photolithographic and etching techniques are used to form a trench line 210 and a via 212 passing through the dielectric layer 208. Preferably, the fabricating process for forming the trench line 210 and the via 212 includes a dual damascene process. For example, the trench line 210 is formed in the silicon nitride layer 208e and the silicon oxide layer 208d using the silicon nitride layer 208c as an etching stop layer. The via 212 is formed in the silicon nitride layer 208a, the silicon oxide layer 208b and the silicon nitride layer 208c under the trench line 210 and exposes the conductive plug 206.

Figure 2C:
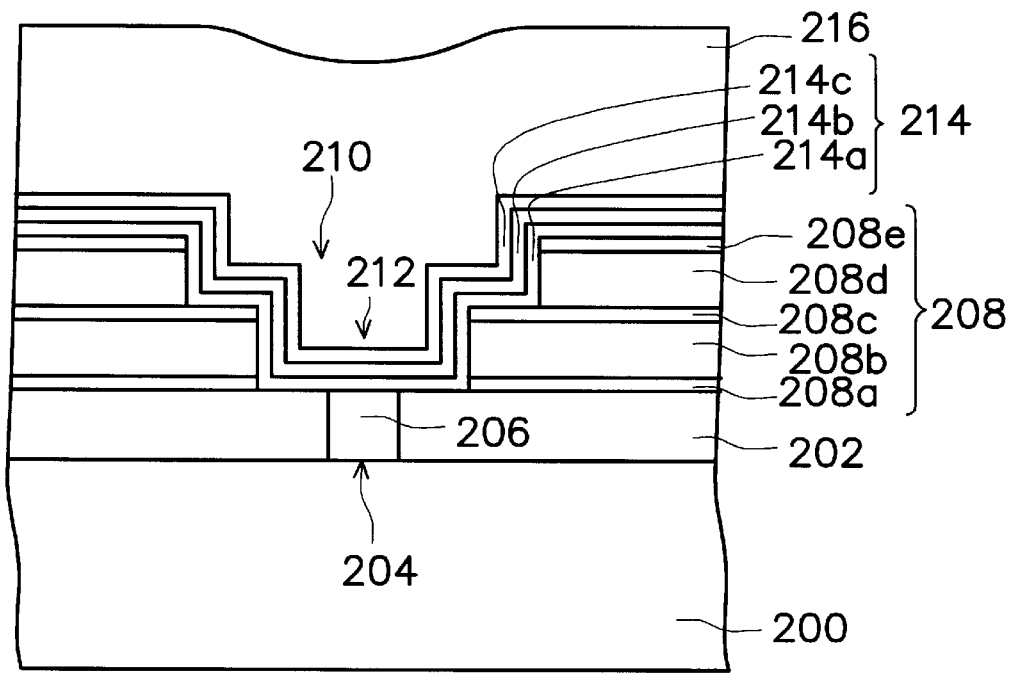

As shown in FIG. 2C, an amorphous silicon layer 214 conformal to the trench line 210, the via 212 and the surrounding dielectric layer 208 is formed. The amorphous silicon layer 214 can be formed, for example, using a low-pressure chemical vapor deposition (LPCVD) method at a temperature of between 510° C. to 520° C. Moreover, the amorphous silicon layer 214 of a tri-layer structure includes an undoped amorphous silicon layer 214a, a heavily doped amorphous silicon layer 214b, and an undoped amorphous silicon layer 214c.

The heavily doped amorphous silicon layer 214b, for example, has a doping concentration preferably around 6E20 ions/cm$^3$. The heavily doped amorphous silicon layer 214b can reduce the capacitance depletion effect.

In the subsequent step, a photoresist layer 216 is formed over the amorphous silicon layer 214 so that the trench line 210 and the via 212 is also filled.

Figure 2D:
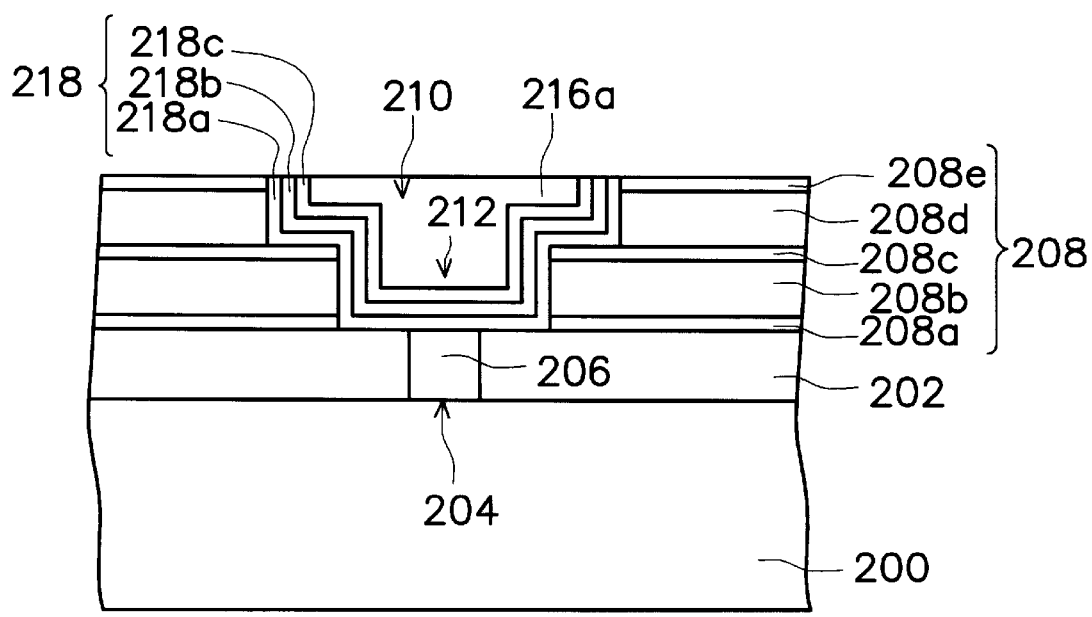

As shown in FIG. 2D, the photoresist layer 216 and the amorphous silicon layer 214 above the dielectric layer 208 are removed using the silicon nitride layer 208e as an etching stop layer. Thus, only a portion of the photoresist layer 216a and a double-crown shaped amorphous silicon layer 218 remain inside the trench line 210 and the via 212. The double-crown shaped amorphous silicon layer 218 of a tri-layer structure includes an undoped amorphous silicon layer 218a, a heavily doped amorphous silicon layer 218b, and an undoped amorphous silicon layer 218c.

The photoresist layer 216 and the amorphous silicon layer 214 above the dielectric layer 208, for example, are removed using a chemical mechanical polishing (CMP) method.

Generally, a slurry with a good polish ability to oxide is used during the chemical mechanical polishing (CMP) process in prior art, and the slurry is referred as a oxide slurry. However, the oxide slurry usually has a low polishing selectivity of amorphous silicon to silicon nitride, i.e. 3~5, so that the polish end point is hard to be detected and the polished wafer of worse uniformity is always performed.

Therefore, a poly slurry having a good polish ability to amorphous silicon is used during the chemical mechanical polishing (CMP) process in this invention. The poly slurry has a high polishing selectivity of amorphous silicon to silicon nitride, i.e. higher than 80, so that the polish end point is easy to be detected and the polished wafer of good uniformity is performed.

Figure 2E:
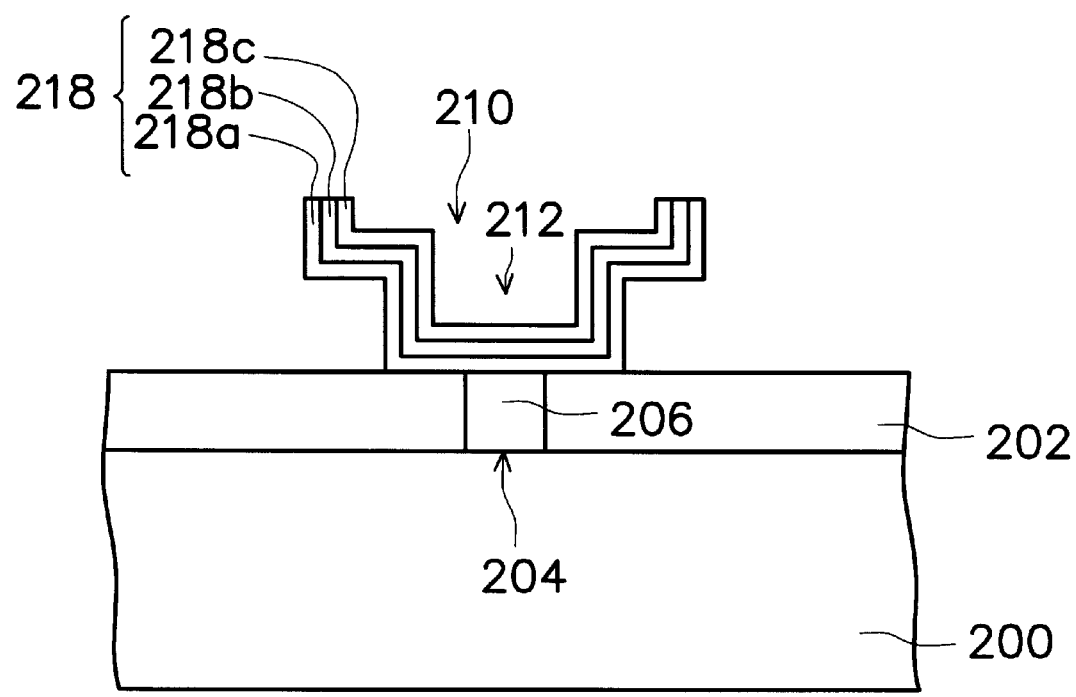

As shown in FIG. 2E, thereafter, the photoresist layer 216a inside the trench line 210 and the via 212 is also removed using, for example, a wet etching method. Ultimately, only the double-crown-shaped amorphous silicon layer 218 remains inside the trench line 210 and the via 212.

The dielectric layer 208 is removed using, for example, a wet etching method.

Figure 2F:
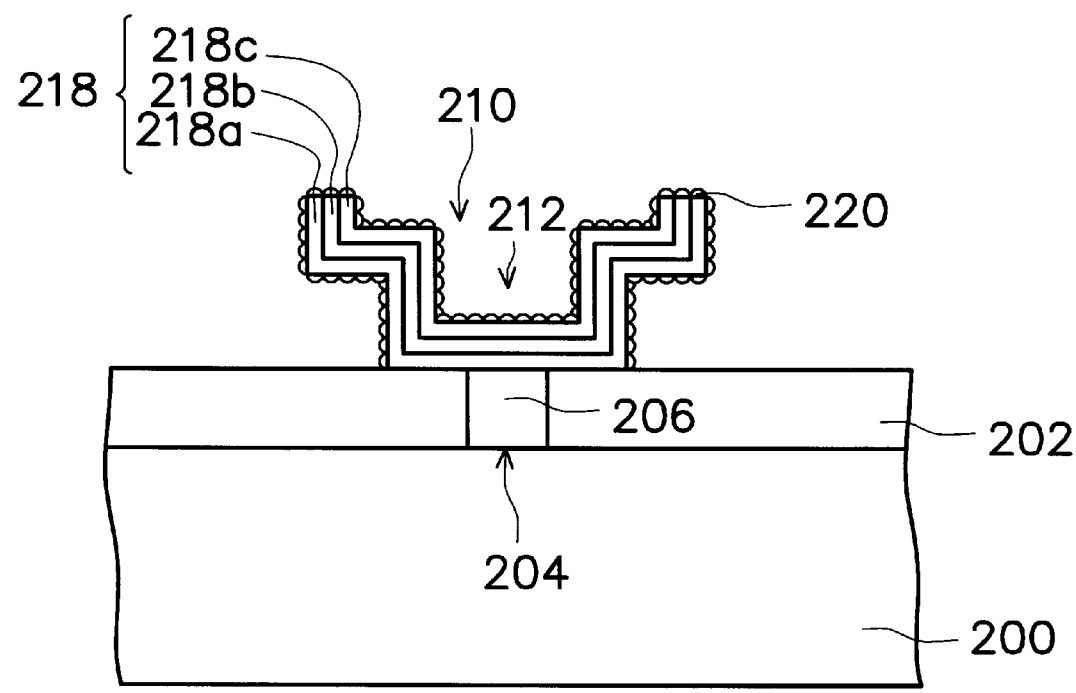

As shown in FIG. 2F, subsequently, a multitude of hemispherical grains 220 is formed on the exposed surface of the double-crown-shaped amorphous silicon layer 218. The hemispherical grains 220 are formed over the amorphous silicon layer 218 by first seeding nuclei for forming hemispherical grains 220 selectively over the double-crown-shaped amorphous silicon layer 218. The seeding can be done using silane (SiH$_4$) or disilane (Si$_2$H$_6$) in a high vacuum (about 10$^{-3}$ to 10$^{-4}$ Torr). A heat treatment is then carried out, in an ultra high vacuum (about 10$^{-8}$ to 10$^{-9}$ Torr) so that silicon atoms inside the double-crown-shaped amorphous silicon layer 218 are able to migrate towards the respective nuclei. The nuclei are grown into hemispherical grains 220.

Since the hemispherical grains 220 is formed on a surface of the two undoped amorphous silicon layer 218a and 218c so that the migration of the silicon atoms in the undoped amorphous silicon layer 218a and 218c are not inhibited. The hemispherical grains 220 are therefore easily formed and possess a higher surface area-gain.

Figure 2G:
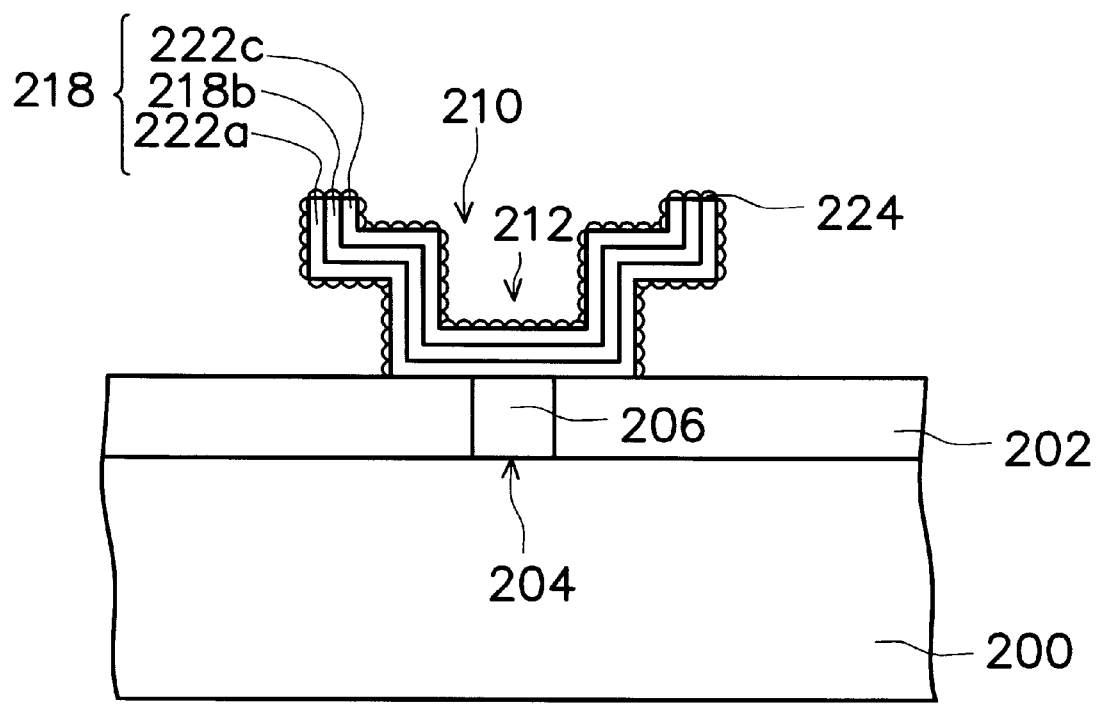

As shown in FIG. 2G, a doping process for the hemispherical grains 220, the undoped amorphous silicon layer 218a and 218c is performed to result in doped hemispherical grains 224, doped amorphous silicon layer 222a and 222c. Thus, the capacitance depletion effect can be resolved.

The doping process is performed by using, for example, a phosphine (PH$_3$) treatment of about 5 to 30 minutes with a phosphine (PH$_3$) gas pressure of around 1 to 10 torr and at a temperature of between about 700° C. to 750° C.

Subsequent operations of forming a capacitor dielectric layer and an upper electrode are formed over the doped hemispherical grains 224, doped amorphous silicon layer 222a and 222c, and a double-sided double-crown-shaped capacitor is completely manufactured. These process are familiar to those skilled in semiconductor manufacture, therefore, detailed description is omitted.

In short, this invention utilizes a manufacture method of a trench line and a via applied in dual damascene process to form a trench line and a via in a dielectric layer. Then, multi-amorphous silicon layers with different doping concentration are conformally formed on a exposed surface of the trench line and the via to serve as a bottom electrode of a double-sided double-crown-shaped capacitor. Furthermore, a phosphine (PH$_3$) treatment process is performed after hemispherical grains formed on the bottom electrode of the double-sided double-crown-shaped capacitor to increase the doping concentration of the bottom electrode surface of the capacitor.

Since this invention utilizes a manufacture method of a trench line and a via applied in dual damascene process to form a double-sided double-crown-shaped capacitor. It provides more bottom electrode surface of a capacitor to increase the capacitance of a memory device.

In this invention, a poly slurry having a good polish ability to amorphous silicon is used during a chemical mechanical polishing process. The poly slurry has a high polishing selectivity of amorphous silicon to silicon nitride, i.e. higher than 80, so that the polish end point is easily to be detected and good uniformity of a polished wafer can be promoted.

In this invention, an amorphous silicon layer formed as a double-sided double-crown-shaped structure has an undoped concentration surface which does not inhibit migration of silicon atoms during the formation of hemispherical grains. The hemispherical grains therefore are easily formed and possess a higher surface area-gain.

After the formation of the hemispherical grains, a phosphine (PH$_3$) treatment is performed to increase the doping concentration of the bottom electrode surface of a capacitor. Thus, the capacitance depletion effect can be resolved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a stacked capacitor, comprising the steps of:
   providing a substrate;
   forming a first dielectric layer over the substrate;
   forming a contact opening in the first dielectric layer. wherein a depth of the contact opening is substantially equal to a thickness of the first dielectric layer;
   forming a conductive plug inside the contact opening;
   forming a second dielectric layer on the first dielectric layer that covers the conductive plug also;

forming a trench line in a top portion of the second dielectric layer;

forming a via in a bottom portion of the second dielectric layer beneath the trench line to expose the conductive plug and a portion of the first dielectric layer abutting the conductive plug;

forming an undoped first amorphous silicon layer on the second dielectric layer, conformal to a peripheral surface of the trench line and the via;

forming a doped second amorphous silicon layer on and conformal to the undoped first amorphous silicon layer;

forming an undoped third amorphous silicon layer on and conformal to the doped second amorphous silicon layer;

forming a photoresist layer over the substrate to fill the trench line and the via in the second dielectric layer;

polishing the photoresist layer, the undoped third amorphous silicon layer, the doped second amorphous silicon layer and the undoped first amorphous silicon layer to expose the second dielectric layer using the second dielectric layer as a polishing stop layer;

removing the photoresist layer filling in the trench line and the via;

removing the second dielectric layer;

forming a plurality of hemispherical grains over an exposed surface of the undoped first amorphous silicon layer, the doped second amorphous silicon layer and the undoped third amorphous silicon layer; and performing a doping process to the hemispherical grains, the undoped first amorphous silicon layer and the undoped third amorphous silicon layer.

2. The method of claim 1, wherein the second dielectric layer includes a first silicon nitride layer, a first silicon oxide layer, a second silicon nitride layer, a second silicon oxide layer and a third silicon nitride layer.

3. The method of claim 2, wherein the trench line is formed in the second silicon oxide layer and the third silicon nitride layer using the second silicon nitride layer as a etching stop layer.

4. The method of claim 2, wherein the via is formed in the first silicon nitride layer, the first silicon oxide layer and the second silicon nitride layer using the first dielectric layer as a etching stop layer.

5. The method of claim 1, wherein the doped second amorphous silicon layer has a doping concentration preferably around 6E20 ions/cm$^3$.

6. The method of claim 1, wherein the photoresist layer, the undoped third amorphous silicon layer, the doped second amorphous silicon layer and the undoped first amorphous silicon layer above the second dielectric layer are removed by chemical mechanical polishing method.

7. The method of claim 6, wherein a poly slurry used in the chemical mechanical polishing method has a high polishing selectivity of amorphous silicon to silicon nitride.

8. The method of claim 1, wherein the doping process includes a phosphine (PH$_3$) treatment process.

9. The method of claim 8, wherein the phosphine (PH$_3$) treatment process is performed for about 5 to 30 minutes with a phosphine (PH$_3$) gas pressure of around 1 to 10 torr and at a temperature of between about 700° C. to 750° C.

10. A method for manufacturing a stacked capacitor, comprising the steps of:

providing a substrate having a number of devices and a conductive plug formed thereon;

forming a dielectric layer over the substrate;

forming a trench line and a via beneath the trench line in the dielectric layer to expose the conductive plug, wherein a portion of the substrate abutting the conductive plug is exposed also;

forming an undoped first amorphous silicon layer over the dielectric layer conformal to the trench line and the via;

forming a doped second amorphous silicon layer on and conformal to the undoped first amorphous silicon layer;

forming an undoped third amorphous silicon layer on and conformal to the doped second amorphous silicon layer;

forming a photoresist layer over the substrate to fill the trench line and the via;

polishing the photoresist layer, the undoped third amorphous silicon layer, the doped second amorphous silicon layer and the undoped first amorphous silicon layer to expose the dielectric layer using the dielectric layer as a polishing stop layer;

removing the photoresist layer filling in the trench line and the via;

removing the dielectric layer;

forming a plurality of hemispherical grains over an exposed surface of the undoped first amorphous silicon layer, the doped second amorphous silicon layer, and the undoped third amorphous silicon layer; and performing a doping process to the hemispherical grains, the undoped first amorphous silicon layer and the undoped third amorphous silicon layer. a doping process to the hemispherical grains, the undoped first amorphous silicon layer and the undoped third amorphous silicon layer.

11. The method of claim 10, wherein the dielectric layer includes a first silicon nitride layer, a first silicon oxide layer, a second silicon nitride layer, a second silicon oxide layer and a third silicon nitride layer.

12. The method of claim 11, wherein the trench line is formed in the second silicon oxide layer and the third silicon nitride layer using the second silicon nitride layer as a etching stop layer.

13. The method of claim 11, wherein the via is formed in the first silicon nitride layer, the first silicon oxide layer and the second silicon nitride layer.

14. The method of claim 10, wherein the doped second amorphous silicon layer has a doping concentration preferably around 6E20 ions/cm$^3$.

15. The method of claim 10, wherein the photoresist layer, the undoped third amorphous silicon layer, the doped second amorphous silicon layer and the undoped first amorphous silicon layer above the dielectric layer are removed by chemical mechanical polishing method.

16. The method of claim 15, wherein a poly slurry used in the chemical mechanical polishing method has a high polishing selectivity of amorphous silicon to silicon nitride.

17. The method of claim 10, wherein the doping process includes a phosphine (PH$_3$) treatment process.

18. The method of claim 17, wherein the phosphine (PH$_3$) treatment process is performed for about 5 to 30 minutes with a phosphine (PH$_3$) gas pressure of around 1 to 10 torr and at a temperature of between about 700° C. to 750° C.

19. A method-for manufacturing a stacked capacitor, comprising the steps of:

providing a substrate;

forming a first dielectric layer over the substrate;

forming a contact opening in the first dielectric layer, wherein a depth of the contact opening is substantially equal to a thickness of the first dielectric layer;

forming a conductive plug inside the contact opening;

sequentially forming a first silicon nitride layer, a first oxide layer, a second silicon nitride layer, a second oxide layer, and a third silicon nitride layer on the substrate, wherein the first silicon nitride layer, the first oxide layer, and the second silicon nitride layer serves together as a lower dielectric layer, and the second oxide layer and the third silicon nitride layer serves together as an upper dielectric layer;

patterning the upper dielectric layer to form a trench that exposes a portion of the lower dielectric layer;

patterning the exposed portion of the lower dielectric layer to form a via that at least exposes the conductive plug;

forming an undoped first amorphous silicon layer over the substrate, conformal to a topographic surface of the substrate, including a peripheral surface of the trench and the via;

forming a doped second amorphous silicon layer on and conformal to the undoped first amorphous silicon layer;

forming an undoped third amorphous silicon layer on and conformal to the doped second amorphous silicon layer;

forming a photoresist layer over the substrate to fill the trench and the via in the lower dielectric layer and the upper dielectric layer;

polishing the photoresist layer, the undoped third amorphous silicon layer, the doped second amorphous silicon layer and the undoped first amorphous silicon layer to expose the third silicon nitride layer of the upper dielectric layer that also serves as a polishing stop layer;

removing the photoresist layer filling in the trench and the via;

removing the second dielectric layer;

forming a plurality of hemispherical grains over an exposed surface of the undoped first amorphous silicon layer, the doped second amorphous silicon layer and the undoped third amorphous silicon layer; and performing a doping process to the hemispherical grains, the undoped first amorphous silicon layer and the undoped third amorphous silicon layer.

* * * * *